US006795361B2

United States Patent
Joo

(10) Patent No.: US 6,795,361 B2
(45) Date of Patent: Sep. 21, 2004

(54) LOW POWER CONSUMPTION MEMORY DEVICE HAVING ROW-TO-COLUMN SHORT

(75) Inventor: Yangsung Joo, Boise, ID (US)

(73) Assignee: Micron Technology, Inc., Boise, ID (US)

(*) Notice: Subject to any disclaimer, the term of this patent is extended or adjusted under 35 U.S.C. 154(b) by 78 days.

(21) Appl. No.: 10/140,411

(22) Filed: May 6, 2002

(65) Prior Publication Data
US 2003/0206476 A1 Nov. 6, 2003

(51) Int. Cl.[7] .................................................. G11C 7/00
(52) U.S. Cl. .................... 365/222; 365/63; 365/189.01; 365/226
(58) Field of Search ........................... 365/222, 63, 51, 365/230.03, 189.01, 226, 227

(56) References Cited

U.S. PATENT DOCUMENTS 5,602,785 A * 2/1997 Casper .................. 365/189.11
5,701,268 A * 12/1997 Lee et al. .................... 365/205
6,330,203 B1 * 12/2001 Earl ............................ 365/222
6,567,332 B2 * 5/2003 Sawhney ..................... 365/222

* cited by examiner

Primary Examiner—Son T. Dinh
(74) Attorney, Agent, or Firm—Schwegman, Lundberg, Woessner & Kluth, P.A.

(57) ABSTRACT

An isolation signal line in a memory device having a standby power mode is configured to be exclusively held as either a logic high or logic low during some portion of the standby power mode and as the other of the logic high and logic low during another portion of the standby power mode to prevent unnecessary switching every time the memory device operates in standby power mode. As a result, memory devices having an upper and lower array achieve true electrical isolation during standby power modes and, if a row-to-column short exists, standby power mode current leakage is cut in half as compared to non-isolated arrays. The switching current necessary to drive the isolation signal line to a bootstrapped logic high during such standby power mode times is likewise prevented. In other embodiments, methods, electronic systems, wafers and DRAM are taught.

42 Claims, 9 Drawing Sheets

LOW POWER CONSUMPTION MEMORY DEVICE HAVING ROW-TO-COLUMN SHORT

FIELD OF THE INVENTION

The present invention relates to memory devices, such as dynamic random access memory (DRAM) devices, having row-to-column shorts. In particular, it relates to memory devices having low power consumption after acquiring such shorts and to the methods for achieving such low power consumption.

BACKGROUND OF THE INVENTION

DRAM devices are a well known type of high-density semiconductor memory used for primary storage (as compared to secondary storage, such as a disk drive) and are often chosen over other memories because of its relative low cost. In exchange for low cost, however, DRAM devices are slower than Static RAM devices, for example, and require periodic refresh operations.

As is known, a DRAM is arranged in an array of rows (often referred to as "word lines") and columns (often referred to as "digit lines"), where the number of rows and columns is usually a power of two. Sometimes, the array is "square" and the number of rows equals the number of columns.

In general, a DRAM array comprises a multiplicity of capacitors to store data. The capacitors are known as cells and each store a single bit of data, either a logic high (1) or a logic low (0). Specifying a particular row and column will address a single memory cell. In the case of a 1024×1024 array (or a 2 to the $10^{th}$ power×2 to the $10^{th}$ power array) a single memory cell would have a 10-bit row address and a 10-bit column address.

All capacitors in the array have an uncommon and common node. The common node is known as a cell plate and has a voltage that is Vcc/2, where Vcc is the voltage supplied to the chip. To store a logic high (1) in a cell, the uncommon node is charged to Vcc through an associated access transistor. To store a logic low (0), the uncommon node (storage node plate) is discharged to ground through the access transistor. A word line (row) signal line is tied to the gate of the access transistor to control access transistor operation.

The data of a cell is read by first equilibrating the cell plate and all digit lines to equilibration voltage Vcc/2. The equilibration voltage is removed and the access transistor for that cell is turned on by supplying an appropriate word line signal. This causes the charge of the capacitor to be dumped to one digit line of a digit line pair. The other digit line of the digit line pairs is used as a reference. If the storage node plate of the capacitor had been charged to Vcc, the voltage on the dumped to digit line of the digit line pairs will increase slightly. Conversely, if the storage node plate had been grounded, the voltage on the digit line will decrease slightly.

The voltage difference between the two digit lines of the digit line pairs is often on the order of 200 mV. Accordingly, the voltage difference is amplified by cross-coupled sense amplifiers (N-sense and P-sense amplifiers) by pulling the digit line with the slightly lower voltage to ground and the digit line with the slightly higher voltage to Vcc. Thereafter, the voltages of the digit line pairs are transferred out of the array to a column decoder and read by an output buffer. This read operation, however, discharges the capacitor of the cell. As such, the same or different logic values are written back to the cell for future use.

Unfortunately, as time passes, the capacitor constituting the cell gradually loses its charge and the data stored therein cannot be accurately read. To prevent data loss, all cells are refreshed periodically in a refresh operation that is similar to a read operation except the data is not actually read. For reference purposes, according to industry standard since about 1970 for a standard DRAM device, a refresh operation occurs about every 15.6 microseconds (refresh rate) for at least one row in an array. Thus, to refresh all rows in a 1024 row×1024 column array, for example, a complete refresh would take about 16 milliseconds or 15.6 microseconds times 1024 rows.

The two basic means of performing the refresh operation are distributed and burst refresh and each can be accomplished by well known RAS (row address strobe) only refresh, CAS (column address strobe) before RAS refresh, and hidden refresh techniques.

In a distributed refresh, all rows are systematically one-at-a-time refreshed by applying evenly-timed row refresh cycles. In a burst refresh, a series of refresh cycles are performed one right after another until all rows are refreshed and then a lag period exists before refresh beings again. When not being refreshed, distributed refresh allows the DRAM to be written to or read from while burst refresh prevents it. Distributed refresh is the more common refresh of the two.

Since its introduction in 1970, DRAM arrays have become more complex and densely fabricated. As such, the occurrences of electrically shorting rows-to-columns has increased. The principle causes of such shorts includes particle contamination and process variability.

In general, a row-to-column short is a point defect that, as its name implies, electrically shorts together a particular row (word line) to a perpendicular column (digit line). As expected, such shorts ruin integrity of the array. Redundant or spare rows and columns are usually fabricated within the array along with redirection circuitry to substitute functional spare rows and columns for those that are shorted—at least to the extent that shorted rows and columns do not exceed the number of spare rows and columns. Even though this redundancy exists, it is important to realize that the shorted rows and columns are not actually disconnected from the array (this is presently impractical, if not impossible due to the minuscule pitch between rows and columns). They are simply no longer addressed.

Adversely, this creates the potential for biased voltage pull down with the attendant problems of excessive standby current, read/write operations resulting in invalid data and possible damage to good cells in the array. For example, in standby power mode, all word lines (rows) are held to ground while the digit lines (columns) are held to Vcc/2 in anticipation of a new access. But, since the row is shorted to the column in at least one cell, Vcc/2 becomes shorted to ground which results in a much higher standby power mode current than is otherwise necessary or even desired.

Some prior art DRAM devices have used well known "bleeder" circuits in an attempt to combat this problem. In such a circuit, the amount of current used to hold a digit line to Vcc/2 is limited, thereby limiting power consumption during a short.

This shorting problem further exacerbates itself in DRAM devices having upper and lower or adjacent arrays that are supposed to be electrically isolated from one another. For example, the isolation devices, that serve to isolate one array from the other, trigger a logic high isolation signal during standby power mode times thereby cross-coupling one array to the other (through the sense amplifiers) and, in the event a row-to-column short exists, the standby power mode current leaks twice as much current (which increases power consumption) as it would if the arrays were in fact isolated.

With reference to FIG. 1, a plurality of prior art signal waveforms are shown to illustrate the problem. Word line signal waveform (WL 110) is shown as it sequentially transitions between logic high 112 and logic low 114 values for all array rows (i, i+1, etc.) in both the upper and lower arrays. It will be appreciated that WL 110 is not a single word line signal but a plurality of word line signals, one for each cell, graphically superimposed as one signal. A break 116 in the signal waveform is shown to depict where signal waveforms transition between the upper and lower array during first and second halves of a refresh operation.

Correspondingly, the isolation signal for the upper array (ISO Upper 113) is logic high 112 during the time interval from time 118 to before time 128 when the word line signal waveform WL 110 transitions to activity in the lower array. It is logic low 114 during the time 128 to the time 130 and during the time 132 to time 134, for example, when the word line signal waveform WL 110 is logic high 112 for the lower array thereby electrically isolating the upper array therefrom. However, during the times when the word line signal waveform WL 110 is logic low 114 in the lower array during all times of standby power mode between time 130 and time 132 and between time 134 and 136, for example, the ISO Upper 113 goes logic high (in a well known bootstrap signal 140 manner). As a result, the upper array is no longer isolated from the lower array and, if a row-to-column short exists, standby power mode current leaks twice as much current as it would if the arrays were in fact isolated. Moreover, the switching current necessary to drive the ISO Upper signal line to a bootstrapped logic high during such times is additionally wasted current.

In a similar manner, the isolation signal for the lower array (ISO Lower 115) is logic high 112 during the time interval from before time 128 to time 136 and beyond when the word line signal waveform WL 110 transitions from activity in the upper to the lower array. It is logic low 114 during the time 118 to the time 120 and during the time 122 to time 124, for example, when the word line signal waveform WL 110 is logic high 112 for the upper array thereby electrically isolating the lower array therefrom. However, during the times when the word line signal waveform WL 110 is logic low 114 in the upper array during all times of standby power mode between time 120 and time 122 and between time 124 and 126, for example, the ISO Lower 115 goes logic high (in a well known bootstrap signal 140 manner). As a result, the lower array is no longer isolated from the upper array and, if a row-to-column short exists, standby power mode current leaks twice as much current as it would if the arrays were in fact isolated. Moreover, the switching current necessary to drive the ISO Lower signal line to a bootstrapped logic high during such times is additionally wasted current.

As DRAM devices continue to grow even denser, the above-identified row-to-column short problems are sure to correspondingly increase. Accordingly, present and future memory devices desire solutions for standby power mode current leakage without suffering a related wafer space penalty.

SUMMARY OF THE INVENTION

The above-mentioned and other problems become solved by applying the apparatus, method and system principles and teachings associated with the hereinafter described low power consumption memory devices having row-to-column shorts.

In one embodiment an isolation signal line in a memory device having a standby power mode is configured to be exclusively held as either a logic high or logic low during some portion of the standby power mode, such as in a self refresh, and as the other of the logic high and logic low during another portion of the standby power mode. In this manner, the isolation signal line is prevented from switching from a logic low to a logic high every time the memory device operates in standby power mode. As a result, memory devices having an upper and lower array achieve true electrical isolation during standby power modes and, if a row-to-column short exists, standby power mode current leakage is cut in half as compared to non-isolated arrays. Moreover, the switching current necessary to drive the isolation signal line to a bootstrapped logic high during such standby power mode times is prevented. Thus, low power consumption in the memory device is achieved.

In another embodiment, an isolation signal line in a memory device is configured to be held as either a logic high or logic low during a first portion of a refresh operation and as the other of the logic high and logic low during a second portion of the refresh operation. In one embodiment, the first and second portions of the refresh operation correspond to first and second halves of a refresh operation where the upper and then lower array is refreshed.

In still another embodiment, methods for achieving low power consumption in memory devices executing standby power modes, refresh operations and read operations are taught. Electronic systems, wafers, and DRAM devices are also described.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE PREFERRED EMBODIMENTS

In the following detailed description of the preferred embodiments, reference is made to the accompanying drawings which form a part hereof, and in which is shown by way of illustration, specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The term wafer used in this specification includes any base semiconductor structure and is to be understood as including silicon-on-sapphire (SOS) technology, silicon-on-insulator (SOI) technology, silicon-on-glass technology, thin film transistor (TFT) technology, doped and undoped semiconductors, epitaxial layers of a silicon supported by a base semiconductor structure, as well as other semiconductor structures well known to one skilled in the art. The following detailed description is, therefore, not to be taken in a limiting sense, and the scope of the present invention is defined only by the appended claims and their equivalents.

Figure 1:
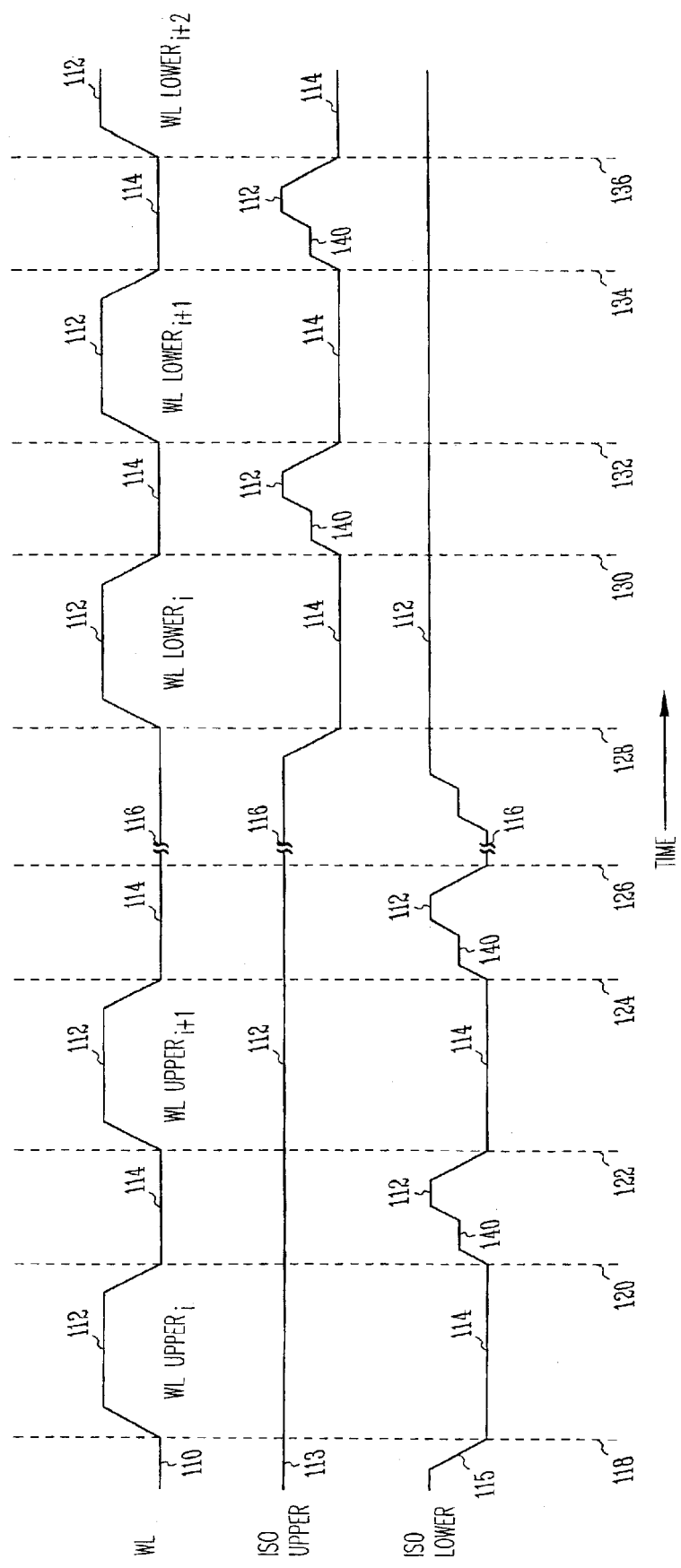
FIG. 1 is a schematic diagram in accordance with the prior art of a plurality of signal waveforms in a DRAM device.

The present description and figures use a reference numeral convention having three digits (XYY) where the first digit of the reference numeral (X) corresponds to the figure number and the following two digits (YY) correspond to an element therein. For example, the word line signal waveform in FIG. 1 is element number 110 and the memory array in FIG. 2 is element number 200.

Figure 2:
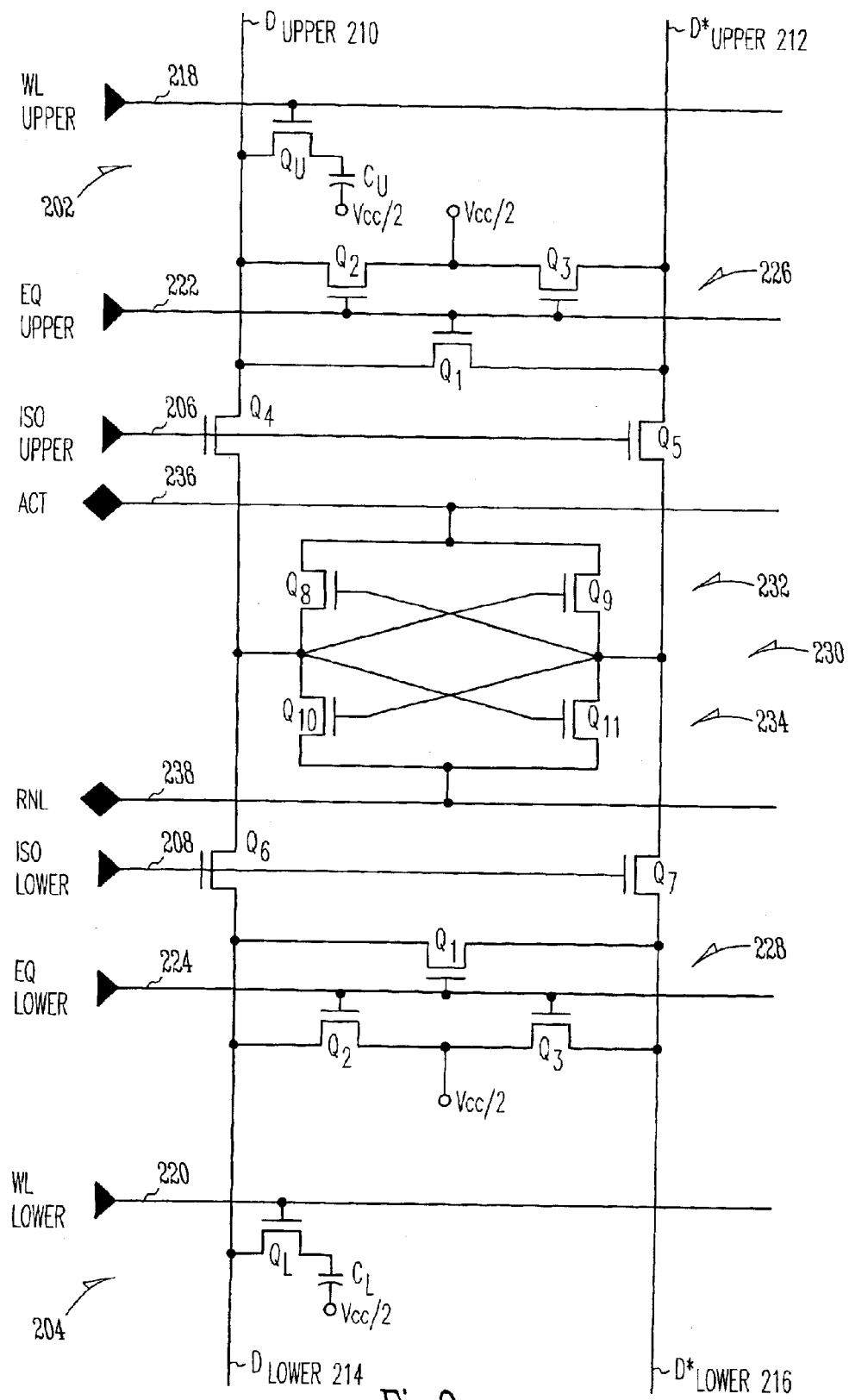
FIG. 2 is a schematic diagram in accordance with the teachings of the present invention of an abbreviated memory array.

With reference to FIG. 2, an abbreviated memory array of a memory device in accordance with the teachings of the present invention is shown generally as 200. The memory array comprises adjacent arrays, upper array 202 and lower array 204, each having a corresponding isolation signal line, ISO Upper 206 and ISO Lower 208, respectively.

A pair of complimentary digit lines, D and D* are shown for each array: D upper 210 and D* upper 212 and D lower 214 and D* lower 216. Upper and lower array word lines (WL) include word lines 218 and 220, respectively. By convention, the digit lines and word lines may interchangeably be referred to as columns and rows, respectively.

Each isolation signal line is tied to a transistor input for transistors disposed in the complimentary word line pairs. In the embodiment shown, ISO Upper is tied to a gate of transistors Q4 and Q5. ISO Lower is tied to the gates of transistors Q6 and Q7. All transistor sources and drains are tied directly to one of the digit line pairs, D or D*, for the upper or lower array. In one embodiment, the transistors are of the NMOS variety.

The isolation of the two arrays serves two general functions. First, as its name implies, if the sense amplifiers (described below) are positioned between and connected to the upper and lower arrays, one array becomes electrically isolated from the other. In this manner, whenever the word line fires in one array, read-write times are accelerated. Second, it provides a stabilizing resistance between the sense amplifiers and the digit lines and speeds the sensing operation by isolating the highly capacitive digit lines from the low-capacitance sense nodes.

Access transistors $Q_U$ and $Q_L$ are provided for the upper and lower memory cells, capacitors $C_U$ and $C_L$, respectively. Their respective inputs (gates) are tied to the upper and lower word lines 218, 220 and are controlled thereby. Their drains are tied to one of the complimentary digit lines 210, 214. Their sources are tied to the an uncommon node of the memory cell. The memory cells ($C_U$ and $C_L$), in turn, have their other node, commonly tied to the cell plate, in this instance, Vcc/2, where Vcc is the voltage supplied to the chip.

During use, as with most memory devices, the capacitors of the memory cell store a single bit of data, either a logic high (1) or a logic low (0) and specifying a particular row and column will address it. To store a logic high (1) in a cell, the uncommon node is charged to Vcc through the access transistor. To store a logic low (0), the uncommon node (storage node plate) is discharged to ground through the access transistor.

An upper and lower equilibration line, EQ Upper 222 and EQ Lower 224, respectively, are provided as input for an upper equilibration circuit, shown generally as 226, and a lower equilibration circuit, shown generally as 228. Both equilibration circuits comprise three transistors, Q1, Q2 and Q3, all having their inputs (gates) tied to their respective equilibration line. The transistor Q1 is the equilibration transistor and the transistors Q2 and Q3 are the equilibration bias transistors. Their drains are tied to one of the complimentary digit lines. Their sources are tied to Vcc/2. In one embodiment the transistors are of the NMOS variety because of their relatively higher drive capacity.

To equilibrate the digit line pairs (i.e., bring the digit line pairs, normally at Vcc and/or ground, to the same voltage level Vcc/2 before the word line goes logic high), the upper or lower equilibration line that is in the same array is held to Vcc. In this manner, an inactive or precharge state for the memory device is indicated. Then, when the row active command is received, the activated array's equilibration line transitions to a logic low value, which turns off the equilibration transistor Q1. The equilibration transistor is of sufficient size to ensure rapid equilibration of the digit line pairs prior to access from the precharge state.

Disposed between the arrays and the digit lines is a cross-couple circuit, generally 230, comprised of a P-sense and N-sense amplifier arrangement, generally as 232 and 234, respectively. An actuation line, ACT 236, is tied to the P-sense arrangement 232 while a RNL line, RNL 238, is tied to the N-sense arrangement 234. The P-sense arrangement includes transistors Q8 and Q9. The N-sense arrangement includes transistors Q10 and Q11.

It will be appreciated that the foregoing described memory device 200 can include many more rows and columns than those shown here for the upper and lower array. In such embodiments, the memory device may include, in one embodiment, a number of rows and columns that are a power of two. In another embodiment, the array may be "square" with the number of rows equaling the number of columns.

In general, and as similarly described in conjunction with the prior art DRAM of the background section, the data of a memory cell is read by first equilibrating the cell plate and all digit lines to equilibration voltage Vcc/2. The equilibration voltage is removed and the access transistor for that cell is turned on by supplying an appropriate word line signal. This causes the charge of the capacitor to be dumped to one digit line of a digit line pair. The other digit line of the digit line pairs is used as a reference. If the storage node plate of the capacitor had been charged to Vcc, the voltage on the dumped to digit line of the digit line pairs will increase slightly. Conversely, if the storage node plate had been grounded, the voltage on will decrease slightly.

The voltage difference between the two digit lines of the digit line pairs is often on the order of 200 mV. Accordingly, the voltage difference is amplified by the cross-coupled sense amplifiers (N-sense and P-sense amplifiers) by pulling the digit line with the slightly lower voltage to ground and the digit line with the slightly higher voltage to Vcc. Thereafter, the voltages of the digit line pairs are transferred out of the array to a column decoder and read by an output buffer. This read operation, however, discharges the capacitor of the cell. As such, the same or different logic values are written back to the cell for future use.

Unfortunately, as time passes, the capacitor constituting the cell gradually loses its charge and the data stored therein cannot be accurately read. To prevent data loss, all cells are refreshed periodically in a refresh operation that is similar to a read operation except the data is not actually read. For reference purposes, according to industry standard since about 1970 for a standard DRAM device, a refresh operation occurs about every 15.6 microseconds (refresh rate) for at least one row in an array. Thus, to refresh all rows in a 1024 row×1024 column array, for example, a complete refresh would take about 16 milliseconds (15.6 microseconds times 1024 rows). Other refresh rates are also embraced herein, such as an "extended" refresh rate of 125 microseconds. The refresh rate is generally arrived at by dividing the memory device's specified refresh time by the number of cycles required to completely refresh it.

The two basic means of performing the refresh operation are distributed and burst refresh and each can be accomplished by well known RAS (row address strobe) only refresh, CAS (column address strobe) before RAS refresh, and hidden refresh techniques.

As is known, in a distributed refresh, all rows are systematically one-at-a-time refreshed by applying evenly-timed row refresh cycles. In a burst refresh, a series of refresh cycles are performed one right after another until all rows are refreshed and then a lag period exists before refresh beings again. When not being refreshed, distributed refresh allows the DRAM to be written to or read from while burst refresh prevents it. In either refresh, it should be appreciated that all rows are eventually refreshed.

In low power applications, such as those found in modern SDRAMs, a self refresh can be used to retain memory data even if the rest of the system is powered down. In a typical self refresh, an SDRAM retains data without external clocking. And once the self refresh mode is engaged, the SDRAM provides its own internal clocking causing it to perform its own auto refresh, as that term is well understood. Often, self refresh must be engaged for some minimum period but can remain indefinitely after that. Upon exiting self refresh, auto refresh is typically engaged.

Figure 3:
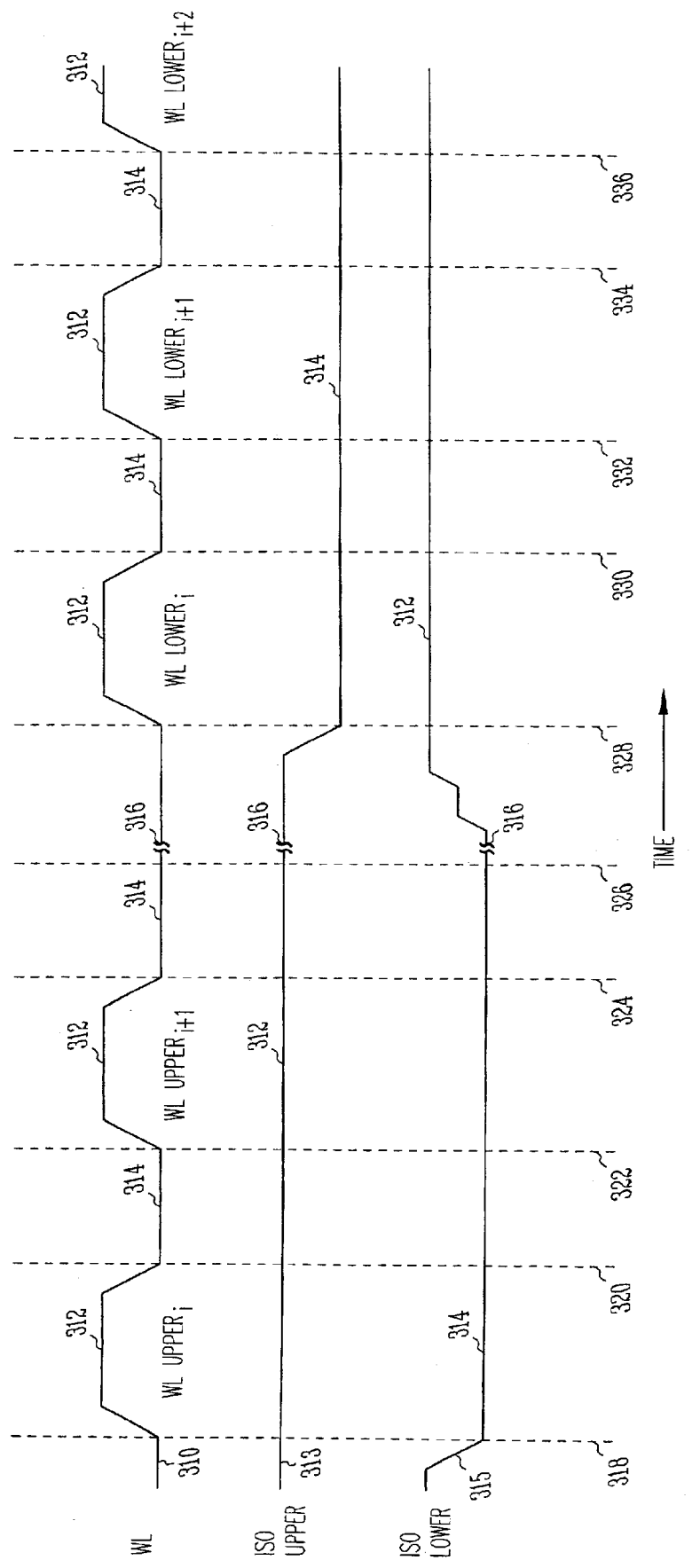
FIG. 3 is a schematic diagram in accordance with the teachings of the present invention of a plurality of isolation signal waveforms for use in the memory array of FIG. 2.

With reference to FIG. 3, a plurality of signal waveforms in accordance with the present invention for achieving low power consumption in a memory device, such as that shown in FIG. 2, are depicted.

In particular, word line signal waveform (WL 310) is shown as it sequentially transitions between logic high 312 and logic low 314 values for all array rows (i, i+1, etc.) in both the upper and lower arrays. It will be appreciated that WL 310 is not a single word line signal but a plurality of word line signals, one for each cell, graphically superimposed as one signal. For example, the word line, WL 310, comprises the signals on WL upper 218 and WL Lower 220 signal lines from FIG. 2.

A break 316 in the signal waveform is shown to depict where signal waveforms transition between the upper and lower array during various portions of a refresh and/or a self refresh operation. In one embodiment, the break 316 shows the half-way position in a refresh operation between the first half, where the rows of the upper array are refreshed, and the second half, where the rows of the lower array are refreshed.

Correspondingly, the isolation signal for the upper array ISO Upper 313 (i.e., for use on ISO Upper 206 in FIG. 2) is logic high 312 during the time interval from before time 318 to just before time 328 when the word line signal waveform WL 310 refreshes the rows of the upper array and before its transition to activity (logic highs and lows) in the lower array. It is logic low 314 during the time 328 to the time 336, and beyond, when the word line signal waveform WL 310 refreshes the rows of the lower array before its transition to activity in the upper array. In other words, the isolation signal line is held as either a logic high or a logic low during a first portion of the refresh operation and as the other of the logic high and logic low during a second portion of the refresh operation.

Many things should now be apparent. First, the ISO Upper 313 no longer transitions from logic low to logic high during time periods for the standby power mode such as between time 320 and time 322, time 324 and time 326, time 330 and time 332, and time 334 and time 336, for example, regardless of whether the word line signal WL 310 is refreshing rows in the upper or lower array. Second, if a row-to-column short exists, the upper array and lower are truly electrically isolated from one another thereby cutting standby power mode current leakage in half as compared to prior art non-isolated arrays. Third, the switching current necessary to drive the isolation signal line to a bootstrapped logic high during such standby power mode times is no longer necessary thereby saving additional current. Fourth, and consequently, power consumption in memory devices is greatly lowered in comparison to prior art devices.

In a similar manner, the isolation signal for the lower array ISO Lower 315 (i.e., for use on ISO Lower 208 in FIG. 2) is logic high 312 during the time interval from before time 328 to time 336, and beyond, when the word line signal waveform WL 310 refreshes the rows of the lower array after its transition from activity in the upper array. It is logic low 314 during the time 318 to the time 326, and beyond, when the word line signal waveform WL 310 refreshes the rows of the upper array before its transition to activity in the lower array. In other words, the isolation signal line is held as either a logic high or a logic low during a first portion of the refresh operation and as the other of the logic high and logic low during a second portion of the refresh operation.

At least one more advantage of the invention should now be apparent. The upper and lower isolation signal lines are configured such that they are logically opposite one another during all periods of activity such as the standby power mode or the refresh operations of the memory device.

Figure 4:
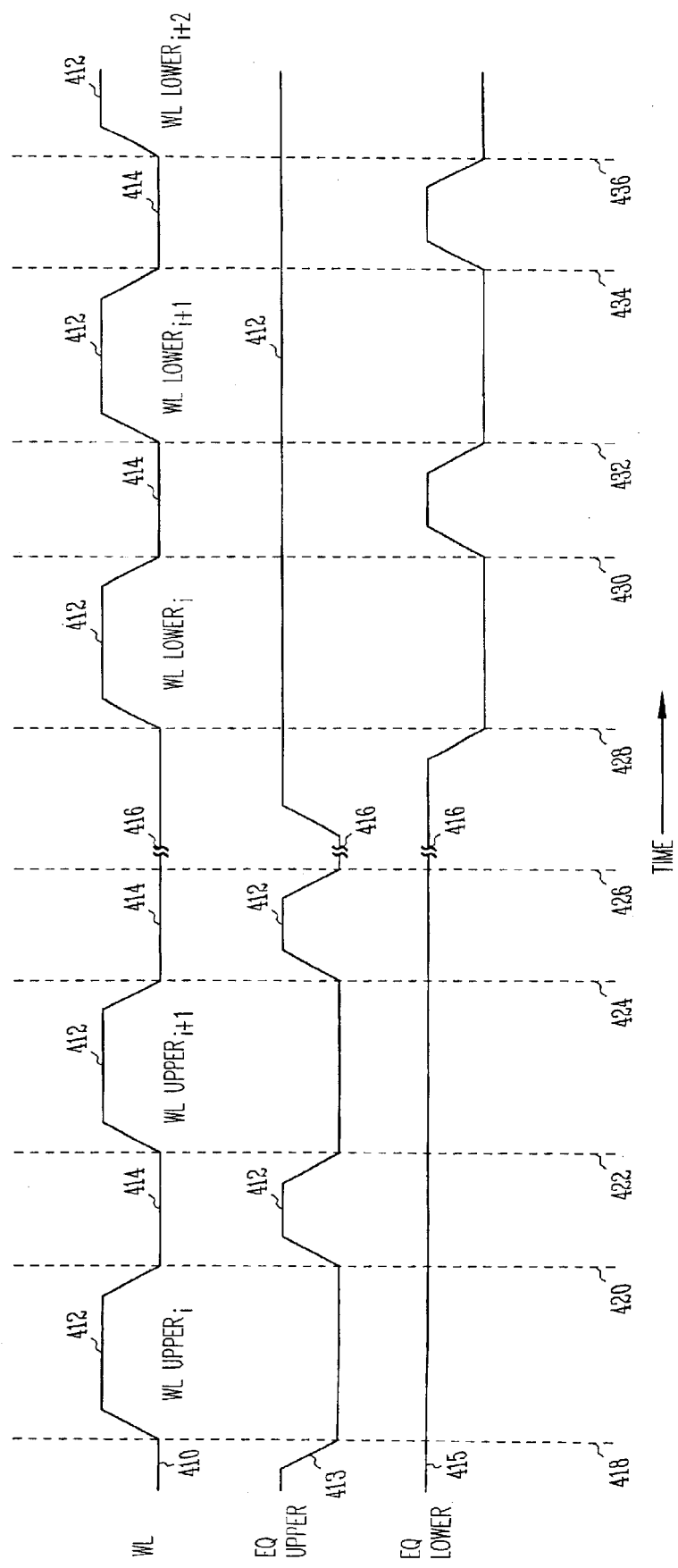
FIG. 4 is a schematic diagram in accordance with the teachings of the present invention of a plurality of equilibration signal waveforms for use in the memory array of FIG. 2.

With reference to FIG. 4, the equilibration signal waveforms in accordance with the present invention for assisting the isolation signal lines in achieving low power consumption in a memory device, such as that shown in FIG. 2, are depicted.

In particular, word line signal waveform (WL 410) is shown as it sequentially transitions between logic high 412 and logic low 414 values for all array rows (i, i+1, etc.) in both the upper and lower arrays. It will be appreciated that WL 410 is not a single word line signal but a plurality of word line signals, one for each cell, graphically superimposed as one signal. For example, the word line, WL 410, comprises the signals on WL upper 218 and WL Lower 220 signal lines from FIG. 2.

A break 416 in the signal waveform is shown to depict where signal waveforms transition between the upper and lower array during various portions of a refresh and/or self refresh operation. In one embodiment, the break 416 shows the half-way position in a refresh operation between the first half, where the rows of the upper array are refreshed, and the second half, where the rows of the lower array are refreshed.

Correspondingly, an equilibration signal for the upper array EQ Upper 413 (i.e., for use on EQ Upper 222 in FIG. 2) is logic high 412 during all WL 410 activity (logic high or low) in the lower array from before time 428 to time 436 and beyond. The EQ Upper 413 is logic low during all times where the WL 410 is logic high during activity in the upper array between times 418 and time 420 and between times 422 and time 424, for example. The EQ Upper 413 is logic high between times 420 and time 422 and times 424 and time 426 when the WL 410 is logic low in the upper array. In other words, the EQ Upper is always logic high during all times of standby power mode between times 420 and time 422, and time 424 and time 426, and time 430 and 432, and time 434 and 436, for example, and logic low when the word line is logic high in the same or upper array.

In a similar manner, an equilibration signal for the lower array EQ Lower 415 (i.e., for use on EQ Lower 224 in FIG. 2) is logic high 412 during all WL 410 activity (logic high or low) in the upper array from before time 418 to time 426 and beyond. The EQ Lower 415 is logic low during all times where the WL 410 is logic high during activity in the lower array between times 428 and time 430 and between times 432 and time 434, for example. The EQ Lower 415 is logic high between times 430 and time 432 and times 434 and time 436 when the WL 410 is logic low in the lower array. In other words, the EQ Lower is always logic high during all times of standby power mode between times 420 and time 422, and time 424 and time 426, and time 430 and 432, and time 434 and 436, for example, and logic low when the word line is logic high in the same or lower array.

In this manner, the digit lines for a particular memory cell are equilibrated to a common voltage before the memory cell is to be read and/or refreshed.

Figure 5:
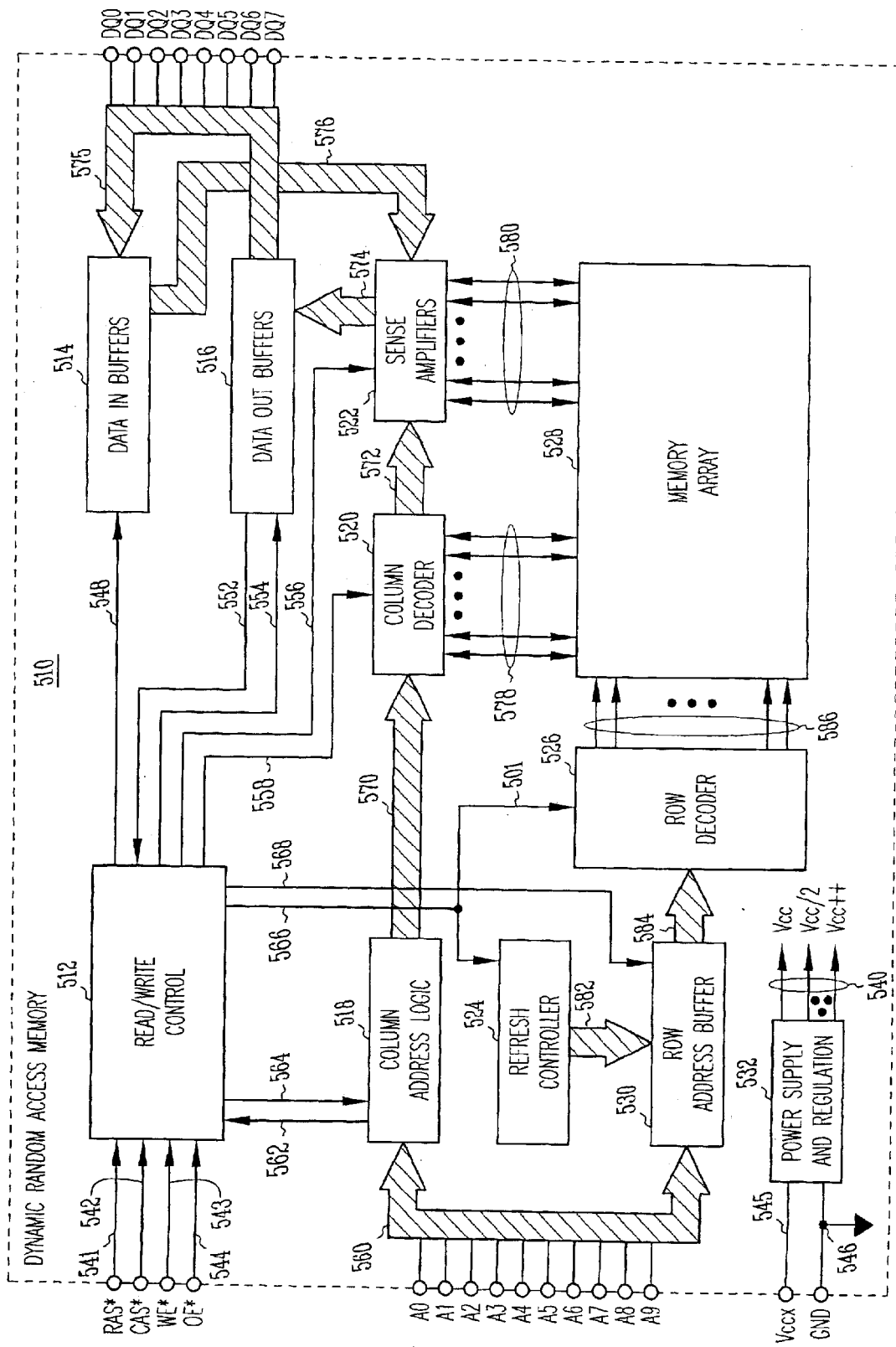
FIG. 5 is a functional block diagram in accordance with the teachings of the present invention of a DRAM using the isolation signal waveforms of FIG. 3.

FIG. 5 is a functional block diagram of a dynamic random access memory according to an embodiment of the memory device of the present invention. Memory 510 provides an output data signal, DQ, corresponding to data stored in the memory. Memory 510 is controlled by binary control signals input on lines 541 through 544 from the device contacts to read/write control 512. Control signals on lines 541–544 are conventionally known by names corresponding to the primary function of each signal. The primary signal on line 541 is row address strobe (RAS*); on line 542 is column address strobe (CAS*); on line 543 is write enable (WE*); and on line 544 is output enable (OE*). When RAS* falls, the state of address bus 560 is latched in row address buffer 530 in response to control signals on line 568. When CAS* falls, the state of address bus 560 is latched in column address logic 518 in response to control signals on line 562.

Several read and write modes of operation (also called cycles) are conducted by read/write control 512 in response to address change signals on line 564 and combinations of control signals on lines 541–544. For example, read/write control 512 responds to changes in the column address as indicated by address change signals on line 564 for improved access time as in page mode. Read/write control 512 generates control signals on lines 548–558 for two different write cycles. The first, early write, follows a RAS*, WE*, CAS* control signal sequence. The second, late write, follows a RAS*, CAS*, WE* control signal sequence.

When RAS* falls while CAS* is low, read/write control 512 provides signals on line 566 to refresh controller 524 to enable self refreshing. Refresh controller 524 includes a clock circuit and means for selecting a cell to refresh. During self refresh mode, refresh controller 524 generates signals on refresh row address bus 582 (for example, as generated by the output of a refresh row address counter or register clocked by an oscillator) to select a row of cells to refresh. Row address buffer 530 provides signals on row address bus 584 to row decoder 526. Signals on binary row address bus 584, in response to control signals on line 568, represents either the address latched when RAS* falls or the refresh row address, depending on the mode of operation. During a refresh cycle, data signals on lines 580 from the selected row are amplified by sense amplifiers 522 causing cells in the row to be refreshed.

In addition to cell refreshing, sense amplifiers 522 respond to control signals on line 556 and column decoder signals on line 572 to perform the memory read cycle. Signals RAS*, CAS*, WE* (high), and address signals AO through A9 cooperate to provide a control signal for a read cycle. In read operations cell content signals on lines 380 are amplified and presented to data out buffers 516 as global I/O signals on line 574. When cell contents are to be overwritten in a write operation, sense amplifiers 522 establish proper cell contents in response to write data signals on line 576 from data-in buffers 514.

Data-in buffers 514 are instrumental for write operations. Signals RAS*, CAS*, WE* (low), OE*, and address signals AO through A9 cooperate to provide a control signal for a write cycle. In write operations cell contents are changed to correspond to the outputs on line 576 of data-in buffers 514. Data-in buffers 514 are driven by data bus 575 which comprises several individual data lines shown as $DQ_n$.

Memory 510 has eight DQ lines, each of which is bidirectional. Alternate memory devices may have less or more DQ lines and may have separate lines for the data-in (D) function and the data-out (Q) function. In memory 510, each bidirectional line is driven by a three state circuit to represent a logic low, a logic high, or an off state. In the off state, the three state circuit connects a high impedance to the DQ line so that drive circuits external to memory 510 can drive a signal onto the DQ line for data-in buffer 514.

Power supply and regulation circuit 532 responds to power supplied to memory 510 on lines 45 ($V_{ccx}$) and 46 (GND) to provide power signals to all other memory functional blocks via power signal lines 540. Power signals 540 include internal Vcc, used generally to power functional blocks of memory 510; Vcc/2 used generally for precharging circuitry that normally attains one of two binary voltage levels symmetric in magnitude about Vcc/2; and Vcc+ used generally booted signals for writing data into memory array 528.

In an equivalent dynamic memory, not shown, storage cells are arranged in a ring rather than in a row-column array as shown in FIG. 5. In such an arrangement, control and address signals different from those shown in FIG. 5 comprise the control signals for a read and a write operation.

Storage ring architectures include magnetic bubble and charge coupled devices as is well known in the art.

In another equivalent memory, not shown, memory 510 additionally includes serial access means coupled to sense amplifiers 522 for providing serial access between the memory array and a serial input/output buffer circuit. In such a memory, control signals 556 include a transfer signal for enabling data transfer between array 528 and the serial access means.

It will be appreciated that array 528 is a complex array and comprises adjacent arrays, such as a top and bottom array as shown in FIG. 2. As described herein, the arrays require isolation from one another as provided by isolation signal lines ISO upper 206 and ISO lower 208 and their corresponding transistors Q4 and Q5 for the upper array and Q6 and Q7 for the lower array. In such an embodiment, the isolation signal lines and corresponding ISO controller are part of the row decoder 526. The self refresh signal 501 is then connected from 526 to the ISO controller in Row decoder 526.

The foregoing description discusses embodiments of the present invention, which may be changed or modified without departing from the scope of the present invention. For example, P-channel FETs may be replaced with N-channel FETs (and vice versa) in some applications with appropriate polarity changes in controlling signals as required. Moreover, the P-channel and N-channel FETs discussed above generally represent active devices which may be replaced with bipolar or other technology active devices.

Still further, those skilled in the art will understand that the nonlinear devices described above may be formed using a wide variety of semiconductor techniques including junctions, formation of layers, doping, and the like. As an example, a nonlinear device in one embodiment is a diode, in another a FET connected as a diode, and in still another a junction of a bipolar transistor. The junction of the diode, FET, or bipolar transistor in one embodiment is formed by doping, in another embodiment is formed by deposition, and in another embodiment is grown.

These and other changes and modifications are intended to be included within the scope of the present invention.

Figure 6:
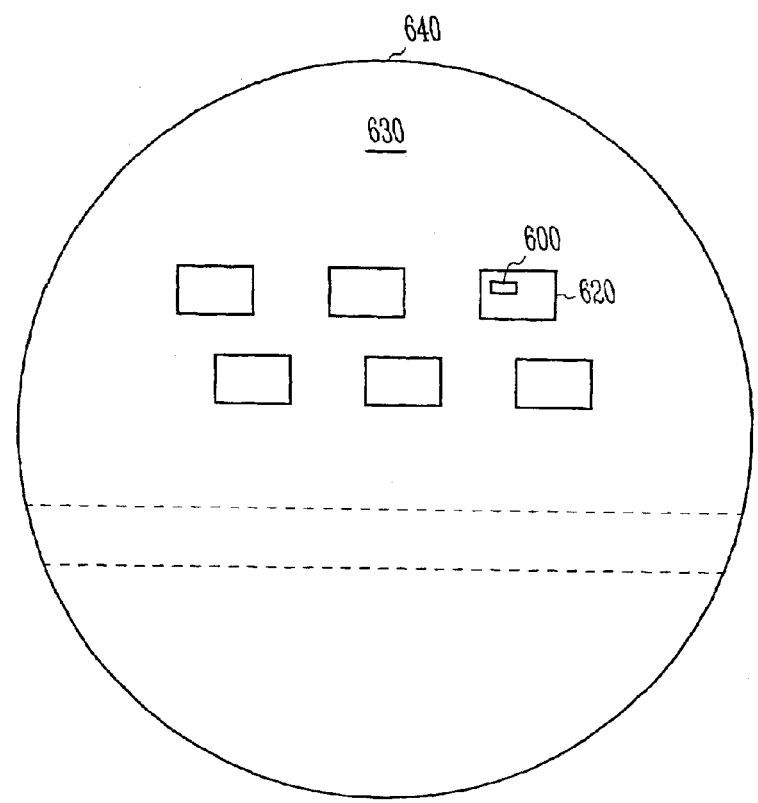
FIG. 6 is a diagrammatic view of a wafer having a memory device in accordance with the teachings of the present invention.

As shown in FIG. 6, at least one memory device 600 that includes the memory array 620 (i.e., memory array 200 of FIG. 2) for executing the signal waveforms of FIGS. 3 and 4 is fabricated on a surface 630 of wafer 640.

As is known, these wafers contain a plurality of dies. Often times as many as one thousand. These dies (chip), which have a plurality of integrated circuit elements therein, must be separated from adjacent dies before packaging.

In the remaining figures, dies will be described as they are used in variety of applications. Some of these dies, it will be appreciated, contain the memory device 200 of the present invention having low power consumption when a row-to-column short exists. They also contain other integrated circuit elements such as capacitors, transistors, lines, interconnects, plugs, pads, I/O connections, insulators and other known elements.

Figure 7:
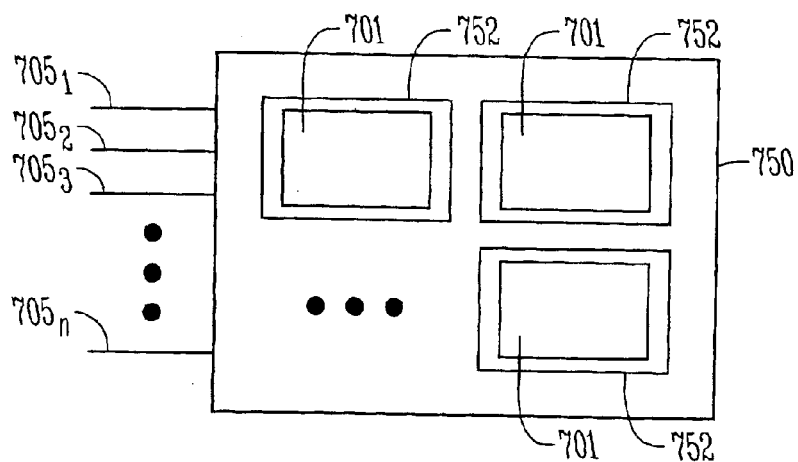
FIG. 7 is a diagrammatic view of a circuit module in accordance with the teachings of the present invention.

As shown in FIG. 7, two or more dies 701 may be combined, with or without protective casing, into a circuit module 700 to enhance or extend the functionality of an individual die 701. Circuit module 700 may be a combination of dies 701 representing a variety of functions, or a combination of dies 701 containing the same functionality. In one embodiment, circuit module 700 includes at least one socket, slot, recess or the like 752 into which the die 701 is received. Slot 752 in one embodiment is a circuit board 750.

Slot 752, in another embodiment, represents a mount including land patterns. In any embodiment, dies 701 may be received by slot 752 in a pick-and-place operation by suitable mick-and-place machines.

Some examples of a circuit module 700 includes memory modules, device drivers, power modules, communication modems, processor modules and application-specific modules, and may include multilayer, multichip modules. Such modules will have a chip receiver in which a chip according to the present invention is inserted. Circuit module 700 may be a subcomponent of a variety of electronic systems, such as a clock, a television, a cell phone, a personal computer, an automobile, an industrial control system, an aircraft and others. Such modules will have a circuit module receiver in which a circuit module according to the present invention is inserted. Circuit module 700 will have a variety of leads $705_1$ through $705_N$ extending therefrom providing unilateral or bilateral communication and control in its particular application.

Figure 8:
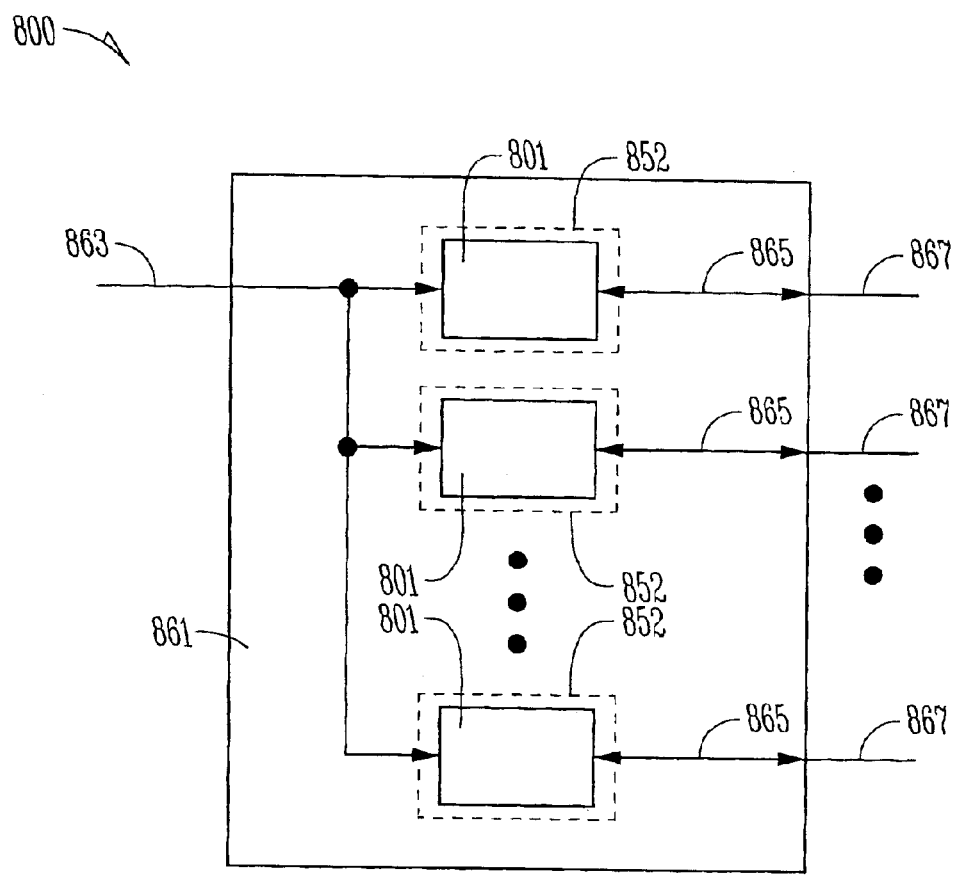
FIG. 8 is diagrammatic view of a memory module in accordance with the teachings of the present invention.

FIG. 8 shows one embodiment of a circuit module as memory module 800. Memory module 800 contains multiple memory devices 801 contained on support 861. In one embodiment, support 861 includes slots 852 for receiving memory devices 801. The number of memory devices generally depends upon the desired bus width and the desire for parity. Memory devices 801 include at least die in accordance with to the present invention. The support 861 includes sockets, slots, recesses or the like 852, each adapted to receive a memory device 801 and provide electrical communication between a bus and memory device 801. Memory module 800 accepts a command signal from an external controller (not shown) on a command link 863 and provides for data input and data output on data links 865. The command link 863 and data links 865 are connected to leads 867 extending from the support 815. Leads 867 are shown for conceptual purposes and are not limited to the position shown in FIG. 8.

Figure 9:
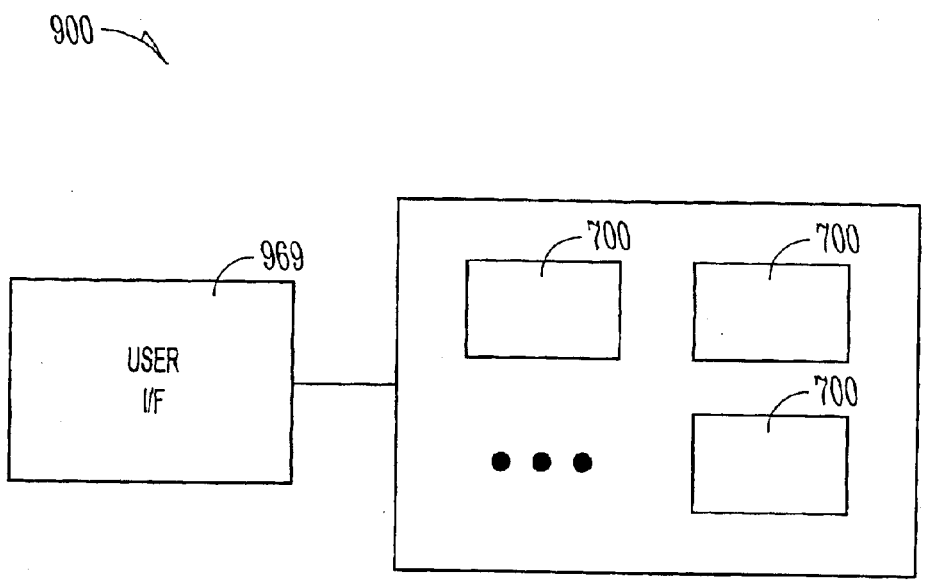
FIG. 9 is a diagrammatic view of an electronic system in accordance with the teachings of the present invention.

FIG. 9 shows one embodiment of an electronic system 900 containing one or more circuit modules 700. At least one of the circuit modules 700 contains a die in accordance with the present invention. Electronic system 900 generally contains a user interface 969. User interface 969 provides a user of the electronic system 900 with some form of control or observation of the results of the electronic system 900. Some examples of user interface 969 include the keyboard, pointing device, monitor or printer of a personal computer; the tuning dial, display or speakers of a radio; the ignition switch, gauges or gas pedal of an automobile; and the card reader, keypad, display or currency dispenser of an automated teller machine. User interface 969 may further describe access ports provided to electronic system 900. Access ports are used to connect an electronic system to the more tangible user interface components previously exemplified. One or more of the circuit modules 700 may be a processor providing some form of manipulation, control or direction of inputs from or outputs to user interface 969, or of other information either preprogrammed into, or otherwise provided to, electronic system 900. In another embodiment, electronic system 900 includes memory modules 800. As will be apparent from the lists of examples previously given, electronic system 900 will often be associated with certain mechanical components (not shown) in addition to circuit modules 700 and user interface 969. It will be appreciated that the one or more circuit modules 700 in electronic system 900 can be replaced by a single integrated circuit. Furthermore, electronic system 900 may be a subcomponent of a larger electronic system.

Figure 10:
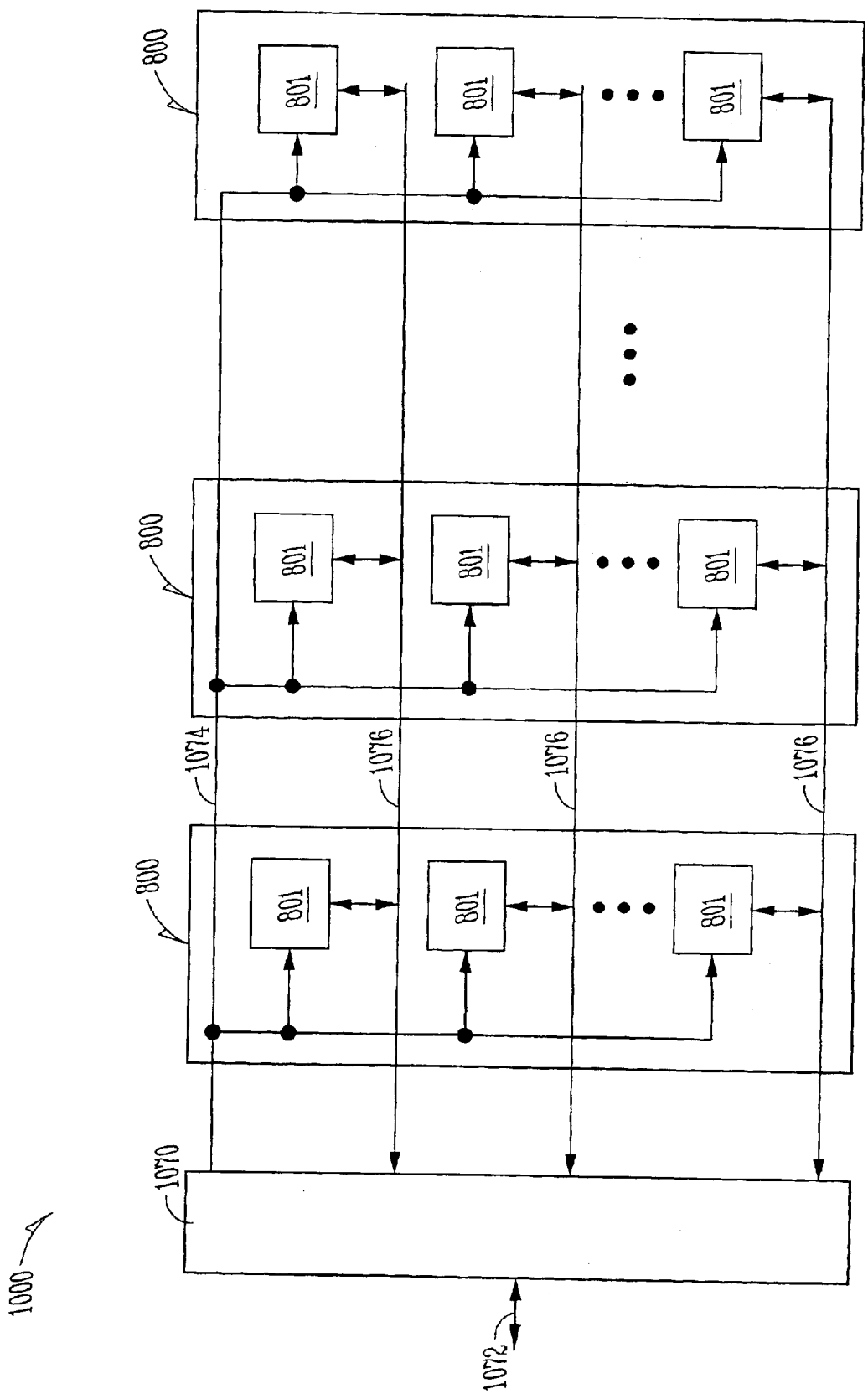
FIG. 10 is a diagrammatic view of an embodiment of an electronic system in accordance with the teachings of the present invention.

FIG. 10 shows one embodiment of an electronic system as memory system 1000. Memory system 1000 contains one or more memory modules 800 and a memory controller 1070. At least one of the memory modules 800 includes a die in accordance with the present invention. Memory controller 1070 provides and controls a bidirectional interface between memory system 1000 and an external system bus 1072. Memory system 1000 accepts a command signal from the external bus 1072 and relays it to the one or more memory modules 800 on a command link 1074. Memory system 1000 provides for data input and data output between the one or more memory modules 800 and external system bus 1072 on data links 1076.

Figure 11:
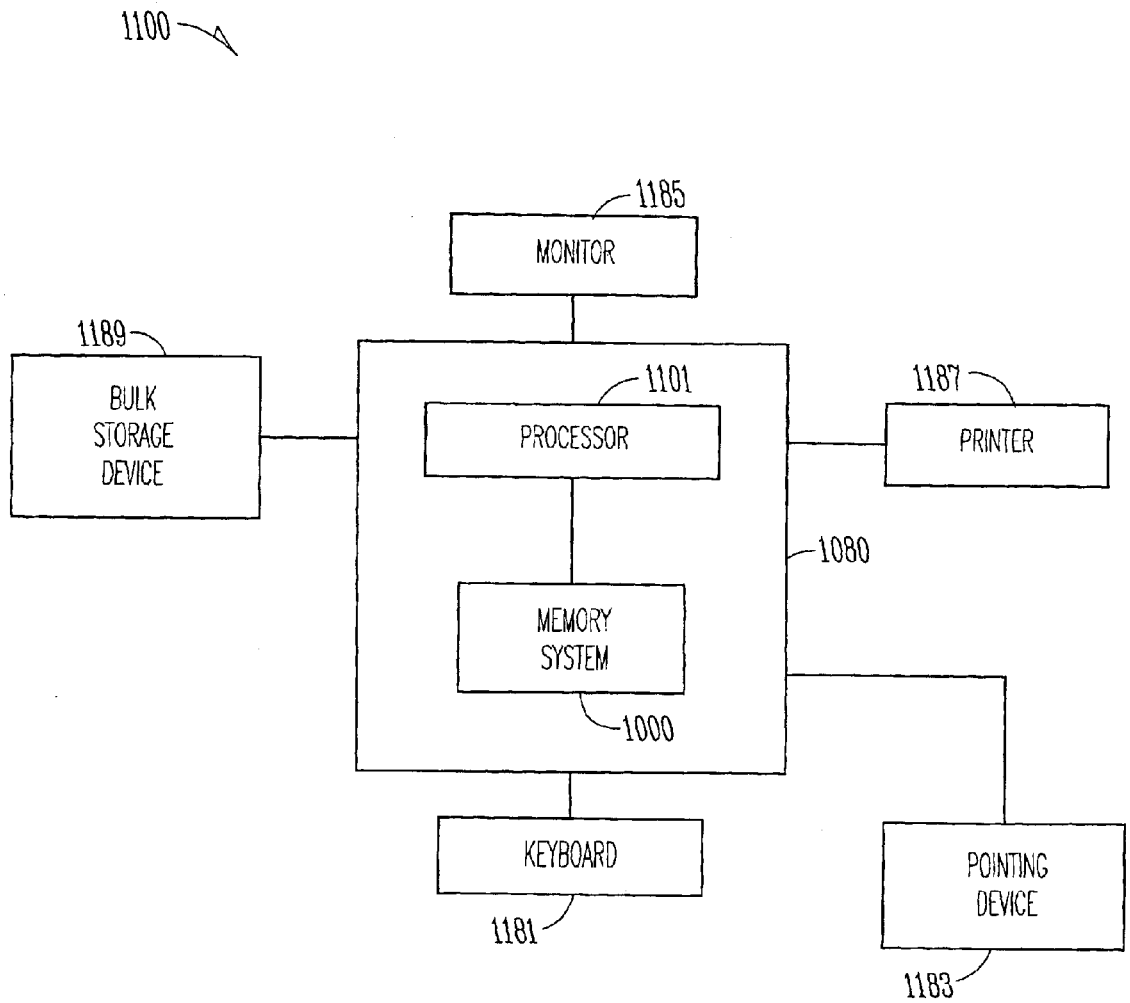
FIG. 11 is a diagrammatic view of a computer system in accordance with the teachings of the present invention.

FIG. 11 shows a further embodiment of an electronic system as a computer system 1100. Computer system 1100 contains a processor 1101 and a memory system 1000 housed in a computer unit 1080. In one embodiment, the memory system 1000 includes a die in accordance with the present invention. In another embodiment, processor 1101 includes a die in accordance with the present invention. Computer system 1100 is but one example of an electronic system containing another electronic system, i.e., memory system 1000, as a subcomponent. Computer system 1100 optionally contains user interface components. Depicted in FIG. 11 are a keyboard 1181, a pointing device 1183 such as a mouse, trackball, or joystick, a monitor 1185, a printer 1187 and a bulk storage device 1189. It will be appreciated that other components are often associated with computer system 1100 such as modems, device drivers, additional storage devices, etc. These other components, in still another embodiment, include at least one die containing an isolation structure of the present invention having improved transistor leakage attributes. It will be appreciated that the processor 1101 and memory system 1000 of computer system 1100 can be incorporated on a single integrated circuit. Such single package processing units reduce the communication time between the processor and the memory circuit.

CONCLUSION

The above structures and fabrication methods have been described, by way of example, and not by way of limitation, with respect to low power consumption memory devices having row-to-column shorts.

In particular, an isolation signal line in a memory device having a standby power mode is configured to be exclusively held as either a logic high or logic low during some portion of the standby power mode, for example as in a self refresh, and as the other of the logic high and logic low during another portion of the standby power mode. In this manner, the isolation signal line is prevented from switching from a logic low to a logic high every time the memory device operates in standby power mode. As a result, memory devices having an upper and lower array achieve true electrical isolation during standby power modes and, if a row-to-column short exists, standby power mode current leakage is cut in half as compared to non-isolated arrays. Moreover, the switching current necessary to drive the isolation signal line to a bootstrapped logic high during such standby power mode times is prevented. Thus, low power consumption in the memory device is achieved.

In another embodiment, an isolation signal line in a memory device is configured to be held as either a logic high or logic low during a first portion of a refresh operation and as the other of the logic high and logic low during a second portion of the refresh operation. In one embodiment, the first and second portions of the refresh operation correspond to first and second halves of a refresh operation where the upper and then lower array is refreshed.

In still another embodiment, methods for achieving low power consumption in memory devices executing standby power modes, refresh operations and read operations are taught. Electronic systems, wafers, and DRAM devices are also described.

The present invention has been particularly shown and described with respect to certain preferred embodiment(s). However, it will be readily apparent to those of ordinary skill in the art that a wide variety of alternate embodiments, adaptations or variations of the preferred embodiment(s), and/or equivalent embodiments may be made without departing from the intended scope of the present invention as set forth in the appended claims. Accordingly, the present invention is not limited except as by the appended claims.

A "signal" refers to mechanical and/or electromagnetic energy conveying information. When elements are coupled or tied, a signal can be conveyed in any manner feasible in light of the nature of the coupling. For example, if several electrical conductors couple two elements, then the relevant signal comprises the energy on one, some, or all conductors at a given time or time period. When a physical property of a signal has a quantitative measure and the property is used by design to control or communicate information, then the signal is said to be characterized by having a "value." The amplitude may be instantaneous or an average. For a binary (digital) signal, the two characteristic values are called logic levels, "high" and "low."

A nonlinear device includes for example a device having voltage dependent conductivity such as bulk semiconductor material, a diode, a transistor channel, or a junction. A resistor includes any device exhibiting resistance including nonlinear resistance such as voltage, temperature, or current dependant resistance.

What is claimed is:

1. A memory device, comprising:
   an isolation signal line configured to be held as one of a logic high and logic low during a first portion of a refresh operation and as the other of the logic high and logic low during a second portion of the refresh operation; and
   a second isolation, signal line held to an opposite logic level of the isolation signal line during at least a portion of word line activation.

2. The memory device according to claim 1, further including an upper array row configured to be refreshed during the first portion of the refresh operation.

3. The memory device according to claim 1, further including a lower array row configured to be refreshed during the second portion of the refresh operation.

4. A memory device configured to execute a standby power mode, comprising:
   an isolation signal line configured to be exclusively held as one of a logic high and logic low during some portion of the standby power mode and as the other of the logic high and logic low during another portion of the standby power mode; and
   a second isolation signal line being held to an opposite logic level of the isolation signal line during at least a portion of standby power mode.

5. A memory device configured to execute a standby power mode, comprising:
   an isolation signal line configured to be exclusively held as one of a logic high and logic low during some portion of the standby power mode and as the other of the logic high and logic low during another portion of the standby power mode; and another isolation signal line configured to be exclusively held to a second logic high and a second logic low logically opposite of the logic high and logic low of the isolation signal line during the some and another portions of the standby power mode.

6. A memory device, comprising:

an upper array having a plurality of upper cells;

a lower array having a plurality of lower cells;

an isolation signal line configured to be exclusively held as one of a logic high and logic low during a self refresh of the plurality of upper cells and as the other of the logic high and logic low during a self refresh operation of the plurality of lower cells; and a second isolation signal line configured to be exclusively held to a second logic high and a second logic low logically opposite of the logic high and logic low of the isolation signal line during word line activation of the self refresh operation.

7. A memory device, comprising:

an upper array having a plurality of upper cells;

a lower array having a plurality of lower cells;

an isolation signal line configured to be exclusively held as one of a logic high and logic low during a self refresh of the plurality of upper cells and as the other of the logic high and logic low during a self refresh operation of the plurality of lower cells; and another isolation signal line configured to be exclusively held to a second logic high and a second logic low logically opposite of the logic high and logic low of the isolation signal line during the self refresh operations of the plurality of upper and lower cells.

8. A memory device, comprising:

an upper array having a plurality of upper cells;

a lower array having a plurality of lower cells;

an isolation signal line configured to be exclusively held as one of a logic high and logic low during a self refresh of the plurality of upper cells mid as the other of the logic high and logic low during a self refresh operation of the plurality of lower cells; and an upper word line for each cell of the plurality of upper cells, each said upper word line configured to be a second logic high during some portion of the read operation of the plurality of upper cells and exclusively a second logic low during the self refresh operation of the plurality of lower cells.

9. A memory device, comprising:

an upper array having a plurality of upper cells;

a lower array having a plurality of lower cells;

an isolation signal line configured to be exclusively held as one of a logic high and logic low during a self refresh of the plurality of upper cells and as the other of the logic high and logic low during a self refresh operation of the plurality of lower cells; and a lower word line for each cell of the plurality of lower cells, each said lower word line configured to be a second logic high during some portion of the read operation of the plurality of lower cells and exclusively a second logic low during the self refresh operation of the plurality of upper cells.

10. A memory device, comprising:

a first isolation signal line configured to be prevented from having one of a logic, high and logic low during a first portion of a refresh operation and prevented from having the other of the logic high and logic low during a second portion of the refresh operation and corresponding to a first memory array; and a second isolation signal line configured to be held to an opposite logic level of the first isolation signal and corresponding to a second memory array.

11. The memory device according to claim 10, further including an upper array configured to be exclusively refreshed during the first portion of the refresh operation and a lower array configured to be exclusively refreshed during the second portion of the refresh operation.

12. A memory device, comprising:

an isolation signal line configured to be prevented from having one of a logic high and logic low during a first portion of a refresh operation and prevented from having the other of the logic high and logic low dining a second portion of the refresh operation; and another isolation signal line configured to be a second logic high and a second logic low logically opposite of the logic high and logic low of the isolation signal line during the first and second portions of the refresh operation.

13. A memory device configured for performing a refresh operation, comprising:

an upper array row configured to be refreshed during a first portion of the refresh operation;

a lower array row configured to be refreshed during a second portion of the refresh operation;

a first isolation signal line being exclusively held as one of a logic high and logic low during the first portion of the refresh operation, and being exclusively held as the other of the logic high and logic low during the second portion of the refresh operation; and a second isolation signal line being held as the opposite logic level of the first isolation signal line so that one of the upper array row and lower array row is being refreshed while the other of the upper array row and lower array row is not being refreshed.

14. The memory device according to claim 13, wherein the upper array row is configured to receive a second logic high during the first portion of the refresh operation.

15. The memory device according to claim 13, wherein the lower array row is configured to receive a second logic high during the second portion of the refresh operation.

16. A memory device configured to execute a standby power mode, comprising:

an upper and lower array having a plurality of upper and lower word lines, respectively, each configured to be a first logic low during the standby power mode; and a plurality of isolation signal lines each configured to be exclusively held as one of a second logic high and second logic low during some portion of the standby power mode and as the other of the second logic high and second logic low during another portion of the standby power mode, one of the plurality of isolation signal lines isolates the upper array and another one of the plurality of isolation signal lines isolates the lower array.

17. The memory device according to claim 16, wherein each of the plurality of isolation signal lines serves to electrically isolate the upper array from the lower array when held as the second logic high.

18. A memory device, comprising:

an array having a plurality of word lines each configured to be a first logic high and first logic low during a refresh operation; and an isolation signal line configured to be exclusively held as one of a second logic high and second logic low during a first half of the refresh operation and as the other of the second logic high and second logic low during a second half of the refresh operation the isolation signal operable for isolating the array from other arrays while the array is being refreshed.

19. The memory device according to claim 18, wherein the array includes an upper array and a lower array, the plurality of word lines being configured as one of an upper word line and a lower word line and additional isolation signal lines configured to isolate one of the upper array from the lower array.

20. A memory device, comprising:

an array having a plurality of word lines each configured to be a first logic high and first logic low during a refresh operation;

an isolation signal line configured to be exclusively held as one of a second logic high and second logic low during a first half of the refresh operation and as the other of the second logic high and second logic low during a second half of the refresh operation; and another isolation signal line, the another isolation signal line configured to be exclusively held to a third logic high and a third logic low logically opposite of the second logic high and second logic low of the isolation signal line.

21. A memory device configured to execute a refresh operation, comprising:

an upper array having a plurality of upper word lines, each said upper word line configured to be one of a first logic high and first logic low;

a lower array having a plurality of lower word lines, each said lower word line configured to be one of a second logic high and second logic low;

an upper isolation signal line configured to be one of a third logic high and third logic low and electrically isolating the upper array from the lower array when held as the third logic high, the upper isolation signal line configured to be prevented from being the third logic high when any of the plurality of lower word lines are the second logic high during the refresh operation; and a lower isolation signal line configured to be one of a fourth logic high and fourth logic low and electrically isolating the upper array from the lower array when held as the fourth logic high, the lower isolation signal line configured to be prevented from being the fourth logic high when any of the plurality of upper word lines are the first logic high during the refresh operation.

22. The memory device of claim 21, further including an upper equilibration signal line prevented from being a fifth logic high when any of the plurality of upper word lines are the first logic high.

23. The memory device of claim 21, further including a lower equilibration signal line prevented from being a fifth logic high when any of the plurality of lower word lines are the second logic high.

24. A memory device configured to execute a self refresh-operation, comprising:

an upper array having a plurality of tipper cells;

a lower array having a plurality of lower cells;

an upper isolation signal line configured to be exclusively held as one of a first logic high and first logic low during the self refresh operation of all the plurality of upper cells and as the other of the first logic high and first logic low during the self refresh operation of all the plurality of lower cells; and a lower isolation signal line configured to be exclusively held as one of a second logic high and second logic low during the self refresh operation of all the plurality of upper cells and as the other of the second logic high and second logic low during the self refresh operation of all the plurality of lower cells.

25. A DRAM configured to execute a standby power mode, comprising:

an upper array having a plurality of upper word lines, each said upper word line configured to be one of a first logic high and first logic low and to be the first logic low during the standby power mode;

a lower array having a plurality of lower word lines, each said lower word line configured to be one of a second logic high and second logic low and to be the second logic low during the standby power mode;

an upper isolation signal line configured to be exclusively held a third logic high during the standby power mode when one of the upper word lines is the first logic low and as a third logic low when one of the lower word linen is the second logic low; and a lower isolation signal line configured to be exclusively held a fourth logic high during the standby power mode when one of the lower word lines is the second logic low and as a third logic low when one of the upper word lines is the logic low.

26. A method, comprising:

providing a memory device having a first isolation signal line and a second isolation signal line;

executing a standby power mode operation in the memory device;

holding the first isolation signal-line to one of a logic high and logic low during one portion of the standby power mode and the other of the logic high and logic low during another portion of the standby power made; and holding the second isolation signal line to the opposite logic state than the first isolation line.

27. A method, comprising:

providing a memory device having an isolation signal line;

executing a standby power mode operation in the mommy device;

holding the isolation signal line to one of a logic high and logic low during one portion of the standby power mode and the other of the logic high and logic low during another portion of the standby power mode; and the memory device has another isolation signal line, further including holding the another isolation signal line to one of a second logic high and second logic low logically opposite the logic high and logic low of the isolation signal line during the one and another portions of the standby power mode.

28. The method according to claim 26, wherein the memory device has a plurality of upper and lower word lines, further including holding each of the tipper and lower word lines as a second logic low during the one and another portions of the standby power mode.

29. A DRAM device performing the method of claim 26.

30. A method, comprising:

providing a memory device having a first isolation signal line and a second isolation signal line;

refreshing the memory device; and holding the first isolation signal line to an active state to isolate one memory array and holding the second isolation line to an inactive state to prevent isolation of another memory array during the refreshing of the memory device.

31. The method according to claim 30, wherein the memory device has an upper and lower array and wherein refreshing the memory device further includes refreshing the upper array during the first half and refreshing the lower array during the second half.

32. A method, comprising:

providing a memory device having an isolation signal line;

refreshing the memory device;

holding the isolation signal line to one of a logic high and logic low during a first half of the refreshing the memory device and the other of the logic high and logic low during a second half of the refreshing the memory device;

wherein the memory device has an upper and lower array and wherein refreshing the memory device further includes refreshing the upper array during the first half and refreshing the lower may during the second half; and wherein the upper array has a plurality of upper word lines and the lower array has a plurality of lower word lines, further including switching each of the plurality of upper word lines between a second logic high and second logic low during the refreshing the upper array and switching each of the plurality of lower word lines between a third logic high and third logic low during the refreshing of the lower array.

33. The method according to claim 32, wherein the memory device has another isolation signal line, further including holding the another isolation signal line to one of a fourth logic high and fourth logic low logically opposite the logic high and logic low of the isolation signal line during the first and second halves.

34. A DRAM device performing the method of claim 33.

35. A method of consuming low power in a memory device having a row-to-column short, comprising:

providing a memory device having a plurality of upper and lower cells and an upper and lower isolation signal line;

self refreshing the plurality of upper and lower cells;

holding the upper isolation signal line to a first logic high during the self refreshing of all the plurality of upper cells;

holding the upper isolation signal line to a first logic low during the self refreshing of all the plurality of lower cells;

holding the lower isolation signal line to a second logic low during the self refreshing of all the plurality of upper cells; and holding the lower isolation signal line to a second logic high during the self refreshing of all the plurality of lower cells.

36. The method according to claim 35, wherein each of the upper cells has an upper word line, further including switching each of the upper word lines between a third logic high and third logic low during the self refreshing the plurality of upper cells.

37. The memory device of claim 36, wherein the memory device has an upper equilibration signal line, further including preventing the upper equilibration line from being a fourth logic high when any of the upper word lines are the third logic high.

38. The method according to claim 35, wherein each of the lower cells has a lower word line, further including switching each of the lower word lines between a third logic high and third logic low during the self refreshing the plurality of lower cells.

39. The memory device of claim 38, wherein the memory device has a lower equilibration signal line, further including preventing the lower equilibration line from being a fourth logic high when any of the lower word lines are the third logic high.

40. A DRAM device performing the method of claim 35.

41. An electronic system, comprising:

a processor; and a memory device coupled to the processor, wherein the memory device includes an isolation signal line configured to be held at an active state to isolate a first portion of the memory device during a first portion of a refresh and configured to be held at an inactive state to de-isolate the first portion of the memory device while a second portion of the memory device is refreshed during a second portion of the refresh operation.

42. A wafer having at least one memory device manufactured thereon, the at least one memory device configured to execute a standby power mode, the at least one memory device comprising:

an isolation signal line configured to be exclusively held as one of a logic high and logic low during some portion of the standby power mode as the other of the logic high and logic low during another portion of the standby power mode; and a second isolation signal line being held to an opposite logic level of the isolation signal line during at least a portion of the standby power mode.

* * * * *

UNITED STATES PATENT AND TRADEMARK OFFICE
CERTIFICATE OF CORRECTION

PATENT NO. : 6,795,361 B2
DATED : September 21, 2004
INVENTOR(S) : Yangsung Joo

It is certified that error appears in the above-identified patent and that said Letters Patent is hereby corrected as shown below:

Column 14,
Line 44, after "isolation" delete ",".

Column 15,
Line 41, delete "mid" and insert -- and --, therefor.
Line 67, delete "," before "high".

Column 16,
Line 15, delete "dining" and insert -- during --, therefor.

Column 17,
Line 61, after "refresh" delete "-".
Line 63, delete "tipper"and insert -- upper --, therefor.

Column 18,
Line 25, delete "linen"and insert -- lines--.
Line 30, after "the" insert -- first --.
Line 36, delete "signal-line" and insert -- signal line --, therefor.
Line 39, delete "made" and insert -- mode --, therefor.
Line 46, delete "mommy"and insert -- memory --, therefor.
Line 60, delete "tipper" and insert -- upper --, therefor.

Column 19,
Line 24, delete "may" and insert -- array --, therefor.

UNITED STATES PATENT AND TRADEMARK OFFICE
CERTIFICATE OF CORRECTION

PATENT NO.     : 6,795,361 B2
DATED          : September 21, 2004
INVENTOR(S)    : Yangsung Joo It is certified that error appears in the above-identified patent and that said Letters Patent is hereby corrected as shown below:

Column 20,
Line 46, after "mode" insert -- and --.

Signed and Sealed this

Seventh Day of June, 2005

JON W. DUDAS
*Director of the United States Patent and Trademark Office*